(12) United States Patent
Oh

(10) Patent No.: US 6,981,187 B1
(45) Date of Patent: Dec. 27, 2005

(54) TEST MODE FOR A SELF-REFRESHED SRAM WITH DRAM MEMORY CELLS

(75) Inventor: Seung Cheol Oh, San Jose, CA (US)

(73) Assignee: Nanoamp Solutions, Inc., Milpitas, CA (US)

( * ) Notice: Subject to any disclaimer, the term of this patent is extended or adjusted under 35 U.S.C. 154(b) by 465 days.

(21) Appl. No.: 10/290,045

(22) Filed: Nov. 6, 2002

(51) Int. Cl.[7] .................................. G11C 29/00
(52) U.S. Cl. ................. 714/718; 714/745; 365/201; 365/222
(58) Field of Search ................. 714/718, 745, 714/733, 721; 365/201, 222

(56) References Cited

U.S. PATENT DOCUMENTS

| | | | |
|---|---|---|---|
| 5,295,109 A * | 3/1994 | Nawaki | 365/222 |
| 6,388,934 B1 * | 5/2002 | Tobita | 365/222 |
| 6,501,693 B2 * | 12/2002 | Takatsuka et al. | 365/201 |
| 6,657,901 B2 * | 12/2003 | Kajigaya et al. | 365/189.02 |
| 6,834,020 B2 * | 12/2004 | Takahashi et al. | 365/222 |
| 2003/0198116 A1 * | 10/2003 | Sato et al. | 365/222 |

* cited by examiner

Primary Examiner—David Ton
Assistant Examiner—John P. Trimmings
(74) Attorney, Agent, or Firm—Patrick T. King

(57) ABSTRACT

A self-refreshing SRAM with internal DRAM memory cells is provided with a test mode enable circuit for testing the real refresh time of the internal SRAM memory cells and for determining the maximum refresh capability of the internal DRAM memory cells. The self-refreshing DRAM includes a test-mode enable circuit, an arbitration circuit, and a memory control logic circuit. In a normal mode of operation, the test mode enable circuit is not active. In a test mode of operation, the test mode enable circuit is active which enables the memory control logic to be controlled by an external command signal that is provided through an external pin, such as a chip-enable /CE pin when the chip is in the test mode.

3 Claims, 3 Drawing Sheets

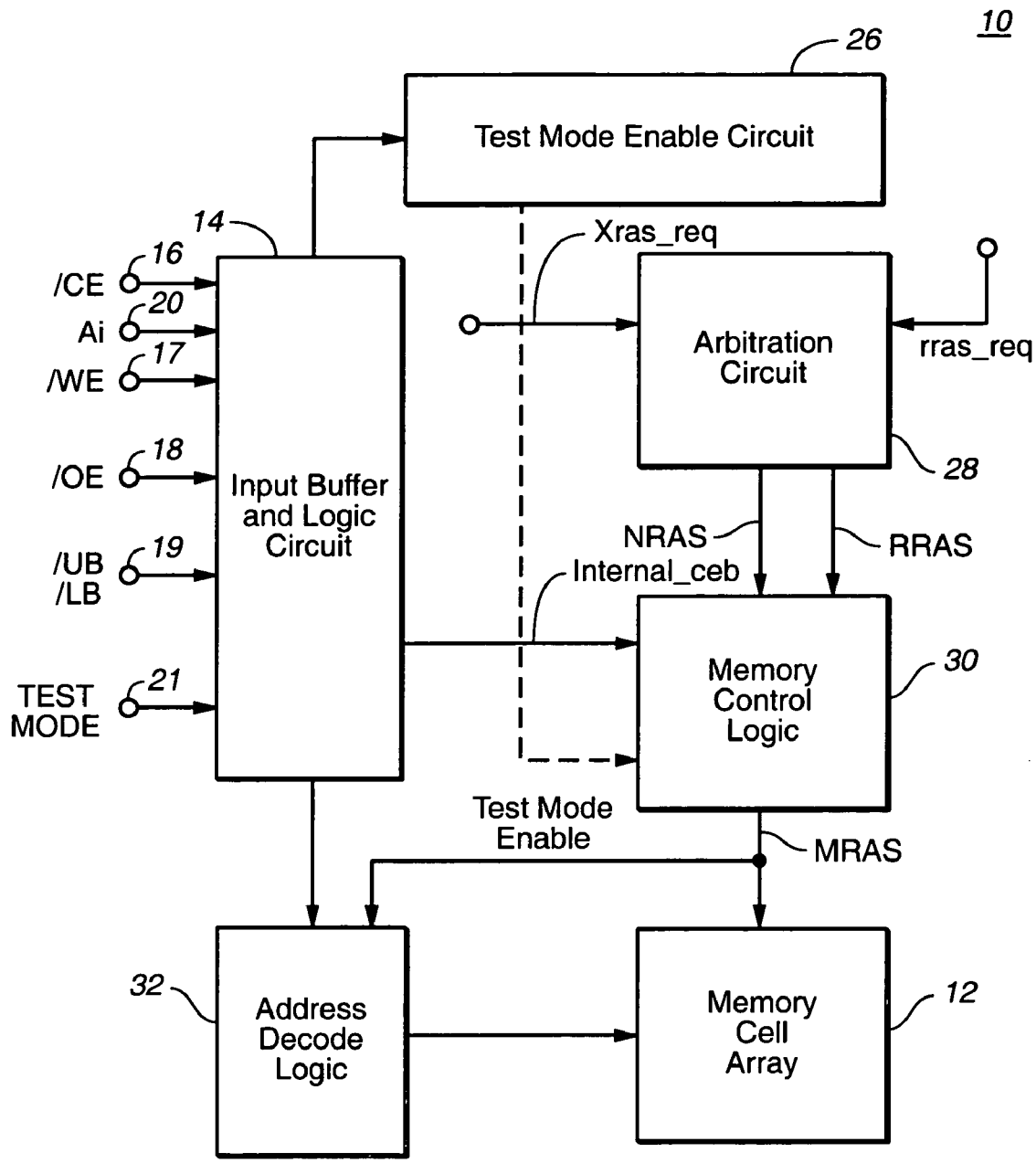
FIG._1

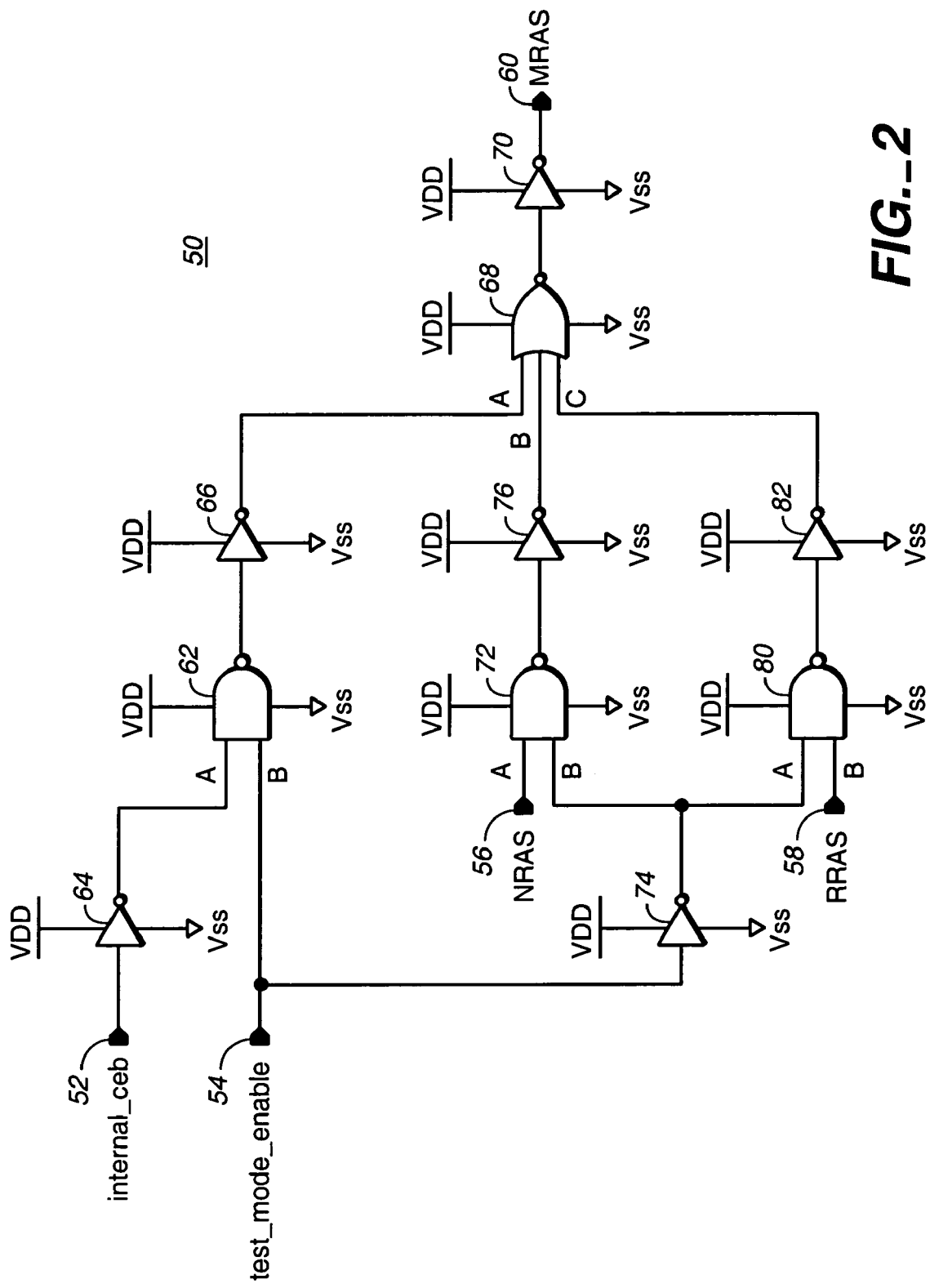
FIG._2

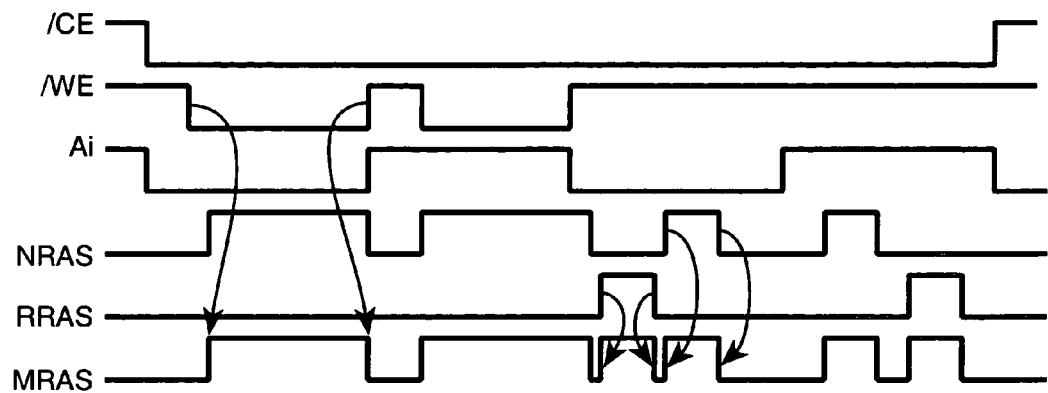
FIG._3
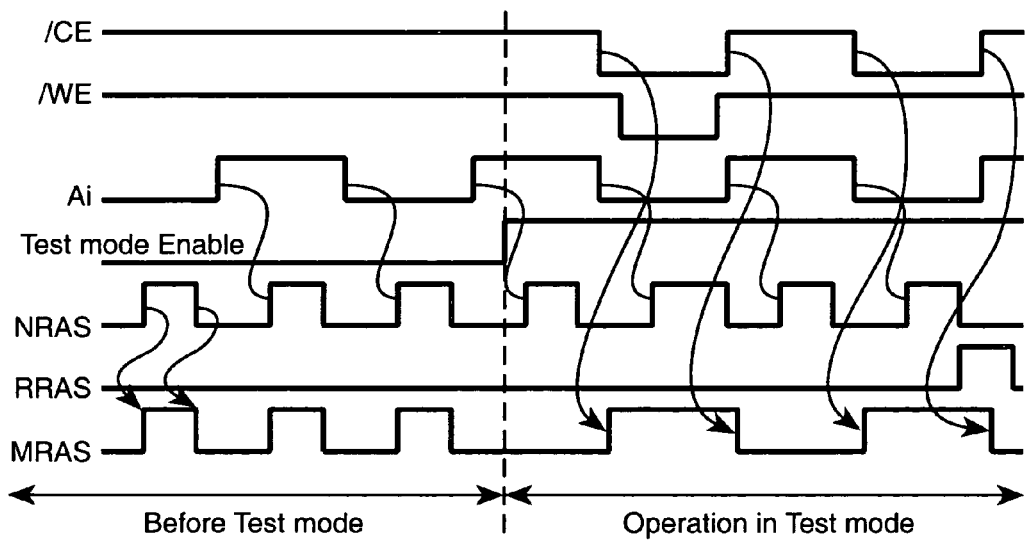
FIG._4

TEST MODE FOR A SELF-REFRESHED SRAM WITH DRAM MEMORY CELLS

BACKGROUND OF THE INVENTION

1. Field of the Invention

This invention relates to self-refreshing static random access memories (SRAMs) that have dynamic random access memory (DRAM) internal memory cells and, more particularly, to circuits for testing certain performance parameters of the DRAM cells.

2. Prior Art

A self-refreshing SRAM is a memory device that internally uses dynamic random access memory DRAM cells and that requires periodic refreshing of those DRAMS cells in a series of internal refresh cycles. A self-refreshing SRAM periodically refreshes its internal dynamic memory cells using an internal system that has an arbitration circuit that arbitrates between internal memory refresh requests and external read/write requests. The arbitration circuit grants access to memory rows for either refreshing or data read/write by providing one of two row access select RAS signals. One RAS signal is a normal row access select NRAS signal that provides access to memory rows during normal read/write operations. The other RAS signal is a refresh row access select RRAS signal that provides access to memory rows during internal refresh cycles.

A conventional self-refreshing SRAM cannot precisely control initiation of an internal refresh operation because all refresh operations are automatically internally controlled by the arbitration circuit. Therefore, the real refresh time or the maximum refresh capability of the DRAM cells cannot be measured exactly.

Consequently, a need exists for a technique that allows the real refresh time and maximum refresh capability of the internal DRAM cells in a self-refreshing DRAM to be measured exactly.

SUMMARY OF THE INVENTION

To overcome the problem of not being able to exactly measure the real refresh time of the DRAM cells in a self-refreshing DRAM, the present invention provides a test mode circuit that disables the arbitration circuit during a test mode of operation. When the test mode circuit is enabled, the arbitration circuit is disabled so that external read/write operation is controlled by an external control signal and the real refresh time can be determined. Refresh time is measured under the control of an external control signal. Also problems between the arbitration circuit and the memory control logic can be checked without requiring mask changes in the memory chip.

The present invention for a self-refreshing SRAM with DRAM cells provides a test-mode enable circuit, an arbitration circuit, and a memory control logic circuit. In a normal mode of operation, the test mode enable circuit is not active. In a test mode of operation, the test mode enable circuit is active which enables the memory control logic to be controlled by an external command signal that is provided through an external pin, such as a chip-enable /CE pin when the chip is in the test mode.

The present invention is for a self-refreshing SRAM that includes an input buffer for control signals, a test mode enable circuit, an arbitration circuit, a memory control logic circuit, an address decode logic circuit, and an array of DRAM memory cells.

The present invention provides a self-refreshing SRAM having a test mode for directly controlling refreshing of DRAM cells. An input buffer receives external control signals for the self-refreshing SRAM. A test mode enable circuit that is activated by an external test mode command signal that provides an internal test_mode_enable signal. An arbitration circuit arbitrates between normal external row access request signals and internal refresh request signals to provide either a normal row access select signal NRAS or an internal refresh row access select signal RRAS. A memory control logic circuit receives the test_mode_enable signal, an internal_ceb signal produced by the input buffer from a /CE input signal, the NRAS signal, and the RRAS signal. The memory control logic circuit also provides a master row access select signal (MRAS) output signal that follows the internal_ceb signal when the test_mode_enable signal is active and that follows the NRAS or XRAS signal when the test_mode_enable signal is inactive. The MRAS signal controls selection of rows of a memory cell array of the self-refreshing SRAM and the MRAS signal also controls an address decode logic circuit for the self-refreshing SRAM so that in a test mode of operation, the refresh time of the memory cells can be externally controlled by the /CE signal to determine the real refresh time of the memory cells and the maximum refresh capability of the memory cells.

The memory control logic circuit includes a test_mode_enable input terminal for receiving a test_mode_enable signal; an internal_ceb input terminal for receiving an internal_ceb signal; a NRAS input terminal for receiving a NRAS signal; a RRAS input terminal for receiving a RRAS signal; an output terminal at which is provided an MRAS output signal; a first 2-input AND function having a first input terminal connected through an inverter to the test_mode_enable input terminal and having a second input terminal connected to the internal_ceb input terminal; a second 2-input AND function having a first input terminal connected to the NRAS input terminal and having a second input terminal that is provided with an inverted test_mode_enable signal; a third 2-input AND function having a first input terminal connected to the RRAS input terminal and having a second input terminal that is provided with the inverted test_mode_enable signal; a 3-input OR function that has input terminals that are coupled to respective output terminals of the first, second, and third 2-input AND functions.

a self-refreshing SRAM having a test mode according to the invention functions so that, in a normal mode of operation, an inactive test_mode_enable signal activates the second and third 2-input AND functions and disables the first 2-input AND function so that the MRAS output signal is provided when either the NRAS signal or the RRAS signal is active. In the test mode of operation, an active test_mode_enable signal activates the first 2-input AND function and disables the second and third 2-input AND functions so that the MRAS output signal is provided when the inverted_internal_ceb signal is active.

In one embodiment of the invention, the first, second, and third AND functions are provided by respective 2-input NAND gates, each having an inverter connected to a respective output terminal of a respective 2-input NAND gates.

A method of testing a self-refreshing SRAM having DRAM cells is also provided according to the invention. The method includes: receiving external control signals for the self-refreshing SRAM in an input buffer; activating a test mode enable circuit with an external test mode command signal to provide an internal test_mode_enable signal; and arbitrating between normal external row access request signals and internal refresh request signals to provide a normal row access select signal NRAS or an internal refresh row access select signal RRAS, The method also includes receiving the test_mode_enable signal, an internal_ceb signal produced by the input buffer from a /CE input signal, the NRAS signal, and the RRAS signal in a memory control logic circuit; and providing a master row access select signal (MRAS) output signal from the memory control logic circuit that follows the internal_ceb signal when the test_mode_enable signal is active and that follows the NRAS or XRAS signal when the test_mode_enable signal is inactive. In this method the MRAS signal controls selection of rows of a memory cell array of the self-refreshing SRAM. The MRAS signal also controls an address decode logic circuit for the self-refreshing SRAM so that in a test mode of operation, the refresh time of the memory cells can be externally controlled by the /CE signal to determine the real refresh time of the memory cells and the maximum refresh capability of the memory cells.

BRIEF DESCRIPTION OF THE DRAWINGS

The accompanying drawings, which are incorporated in and form a part of this specification, illustrate embodiments of the invention and, together with the description, serve to explain the principles of the invention, FIG. 1 is a block diagram of a self-refreshed DRAM that has a test mode enable circuit that enables a memory control logic circuit to provide an externally provided refresh control signal.

FIG. 2 is a circuit diagram of a memory control logic circuit according to the present invention.

FIG. 3 is a timing diagram for a normal access mode of operation.

FIG. 4 is a timing diagram for the circuit of FIG. 1 in a normal mode of operation and in a test mode of operation.

DETAILED DESCRIPTION OF THE PREFERRED EMBODIMENTS

Reference is now made in detail to a preferred embodiment of the invention, an example of which is illustrated in the accompanying drawings. While the invention is described in conjunction with a preferred embodiment, it will be understood that it is not intended to limit the invention to this embodiment. On the contrary, the invention is intended to cover alternatives, modifications and equivalents, which may be included within the spirit and scope of the invention as defined by the appended claims.

FIG. 1 illustrates a block diagram of a self-refreshing DRAM 10 that has DRAM cells in a memory cell array 12. To preserve data in the DRAM cells, periodic internal refreshing of the memory cells is required. Refreshing automatically occurs whenever a word line is accessed either during an internal refresh cycle or during a normal read/write cycle. An input buffer circuit 14 for the SRAM 10 has input pins 16–21 that receive various input control signals for operation of the DRAM. The input signals include: a chip enable /CE signal at pin 16, a write enable /WE signal at pin 17, an output enable /OE signal at pin 18, upper byte /UB or lower byte /LB signals at pin 19, an address change input Ai signal at an input pin 20, and a test mode command signal at pin 21.

Various output signals from the input buffer circuit 14 are provided to a test mode enable circuit 26, an arbitration circuit 28, a memory control logic circuit 30, and an address decode logic circuit 32.

In a normal access mode of operation, the test mode enable circuit 26 does not operate and the arbitration circuit arbitrates, if necessary, between an external access request signal xras_req and an internal refresh request signal rras_req. The arbitration circuit provides an internal refresh control RRAS timing control signal and a normal access NRAS timing signal. Whenever the internal refresh request signal is periodically enabled, an internal refresh cycle is performed automatically without any external command so that all of the memory cells within the array are periodically refreshed. Whenever an external (write or read) access request xras_req signal is received, the arbitration circuit arbitrates between the external access request and the internal refresh request to provide an internal refresh RRAS signal and normal write/read request NRAS signal. After the arbitration circuit provides either a refresh cycle or an NRAS signal for a normal cycle, the memory control logic circuit provides an output master row access select MRAS signal that controls the address decode logic 32 and the memory cell array 12.

Referring to FIG. 2, an example of a memory control logic circuit 50 is shown. An input terminal 52 receives an internal_ceb signal that comes directly from the /CE buffer in the input buffer circuit 14 of FIG. 1. An input terminal 54 receives the test_mode_enable signal from the test mode enable circuit of FIG. 1. An input terminal 56 receives the NRAS signal from the arbitration circuit 28 of FIG. 1. An input terminal 58 receives the RRAS signal from the arbitration circuit 28 of FIG. 1. An output MRAS signal is provided at an output terminal 60.

A 2-input NAND gate 62 has one input terminal connected through an inverter 64 to the input terminal 52 for the internal_ceb signal. Another input terminal of the 2-input NAND gate 62 is connected to the input terminal 54 for the test_mode_enable signal. An output terminal of the 2-input NAND gate 62 is connected to an input terminal of an inverter 66. An output terminal of the inverter 66 is connected to a first input terminal of a 3-input NOR gate 68. An output terminal of the NOR gate 68 is connected to an input terminal of an inverter 70. An output terminal of the inverter 70 is connected to the MRAS output terminal 60. Note that the 2-input NAND gate 62 and the inverter 66 provide a logical AND function. Note also that the 3-input NOR gate 68 and the inverter 70 provide a logical OR function.

Another 2-input NAND gate 72 has one input terminal connected to an output terminal of an inverter 74. One input terminal of the inverter 74 is connected to the input terminal 54 for the test_mode_enable signal. Another input terminal of the 2-input NAND gate 70 is connected to the input terminal 56 for the NRAS signal. An output terminal of the 2-input NAND gate 72 is connected to an input terminal of an inverter 76. An output terminal of the inverter 76 is connected to a second input terminal of the 2-input NOR gate 68. Note that the 2-input NAND gate 72 and the inverter 76 provide a logical AND function.

A third 2-input NAND gate 80 has one input terminal connected to an output terminal of the inverter 74. Another input terminal of the 2-input NAND gate 80 is connected to the input terminal 58 for the RRAS signal. An output terminal of the 2-input NAND gate 80 is connected to an input terminal of an inverter 82. An output terminal of the inverter 82 is connected to a third input terminal of the 2-input NOR gate 68. Note that the 2-input NAND gate 80 and the inverter 82 provide a logical AND function.

In operation, the memory control logic circuit 50 functions such that, when the test_mode_enable signal is inactive LOW, the two 2-input AND functions 72, 76 and 80, 82 each have HIGH signals at one of their input terminals. As a consequence, when either the NRAS signal or the RRAS signal goes to an active HIGH state, the MRAS output signal at terminal 60 goes to an active HIGH state. When the test_mode_enable signal is in an active HIGH state, the two 2-input AND functions 72, 76 and 80, 82 each have LOW signals at one of their input terminals and are blocked from providing an MRAS output signal in response to an active HIGH state for either the NRAS signal or the RRAS signal.

When the test_mode_enable signal is in an active HIGH state, the AND function provided by 62, 66 is activated so that an active LOW state of the internal_ceb signal at input terminal 52 causes an active HIGH MRAS signal at output terminal 60. When the test_mode_enable signal is in an active HIGH state, the MRAS signalis controlled by the active LOW internal_ceb signal.

FIG. 3 shows a timing diagram for a normal access mode of operation without the test mode enable circuit 26 of FIG. 1. The NRAS signal is the normal write/read operation control signal. RRAS is the refresh operation control signal. MRAS is the master combined signal of NRAS and RRAS that controls any access to the memory cell array.

When the /WE signal goes LOW, the command will be for a write operation. When the /WE signal stays HIGH, the command will be for a read operation. The MRAS signal is controlled by the NRAS and the RRAS signal regardless of whether a write or a read operation is requested.

MRAS is always controlled by NRAS and RRAS, so that all memory cells are internally refreshed automatically. With MRAS controlled by either NRAS or RRAS, we cannot measure real refresh time for a DRAM memory cell. If the arbitration circuit has a problem or failure, we cannot check if it is a problem of memory control logic or a problem of the memory cell array.

The present invention illustrated in FIG. 1 provides a test mode of operation that does not use the arbitration circuit and provides for measurement of real refresh time. This allows for checking of any problems between the arbitration circuit and the memory control circuit without requiring a MASK change in the DRAM chip.

The MRAS signal is controlled by NRAS and RRAS before the test_mode_enable signal goes to a HIGH level. Alternatively, after the test_mode_enable signal is enabled to a HIGH level, the MRAS signal is controlled by internal_ceb derived from /CE. When the test mode is enabled with a test mode command on pin 21 of FIG. 1, the NRAS and RRAS signals that come from the arbitration circuit do not control MRAS and are bypassed by the test_mode_enable signal.

FIG. 4 is a timing diagram for the circuit of FIG. 1 in a normal mode of operation and in a test mode of operation. According to the invention, the self-refreshing DRAM circuit 10 of FIG. 1 according to the invention operates in one of two mode of operation, depending upon the state of the test_mode_enable signal as called up by the test mode command signal at pin 21.

The left side of the timing diagram of FIG. 4 illustrates operation of the circuit 10 in a normal mode of operation, that is, when the test_mode_enable signal is at an inactive LOW state. In the normal mode of operation, the MRAS signal is provided by an active NRAS or an active RRAS signal.

The right side of the timing diagram of FIG. 4 illustrates operation of the circuit 10 in a test mode of operation, that is, when the test_mode_enable signal is at an active HIGH state. In the test mode of operation, the MRAS signal is generated by the /CE signal. The NRAS and RRAS signals are cut off when the test_mode_enable signal is in an active HIGH state. When the test_mode_enable signal is active HIGH and the /CE signal goes active LOW, the active HIGH MRAS signal follows the /CE signal. In the test mode of operation, the MRAS signal is independent of the state of either the NRAS signal or the MRAS signal.

A memory cell array is tested, for example, under the control of an external chip-testing machine by trading the memory with test data so that all of the memory cells are charged. The DRAM 10 is put in the test mode and the frequency of the /CE signal is varied until one or more memory cells lose enough charge to produce erroneous output data. Using the /CE signal to control refreshing allows a test operator to determine the real refresh time and the maximum refresh capability of the self-refreshing DRAM 10.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A self-refreshing SRAM having a test mode for directly controlling refreshing of DRAM cells, comprising:
    an input buffer that receives external control signals for the self-refreshing SRAM;
    a test mode enable circuit; that is activated by an external test mode command signal to provide an internal test_mode_enable signal;
    an arbitration circuit arbitrates between normal external row access request signals and internal refresh request signals to provide a normal row access select signal NRAS or an internal refresh row access select signal RRAS; and
    a memory control logic circuit that receives the test_mode_enable signal, an internal_ceb signal produced by the input buffer from a /CE input signal, the NRAS signal, and the RRAS signal and that provides a master row access select signal (MRAS) output signal that follows the internal_ceb signal when the test_mode_enable signal is active and that follows the NRAS or XRAS signal when the test_mode_enable signal is inactive;
    wherein, the MRAS signal controls selection of rows of a memory cell array of the self-refreshing SRAM and wherein the MRAS signal also controls an address decode logic circuit for the self-refreshing SRAM so that in a test mode of operation, the refresh time of the memory cells can be externally controlled by the /CE signal to determine the real refresh time of the memory cells and the maximum refresh capability of the memory cells; and
    Wherein, the memory control logic circuit includes:
    a test_mode_enable input terminal for receiving a test_mode_enable signal;
    an internal_ceb input terminal for receiving an internal_ceb signal;
    a NRAS input terminal for receiving a NRAS signal;

a RRAS input terminal for receiving a RRAS signal;

an output terminal at which is provided an MRAS output signal;

a first 2-input AND function having a first input terminal connected through an inverter to the test mode_enable input terminal and having a second input terminal connected to the internal_ceb input terminal;

a second 2-input AND function having a first input terminal connected to the NRAS input terminal and having a second input terminal that is provided with an inverted test_mode_enable signal;

a third 2-input AND function having a first input terminal connected to the RRAS input terminal and having a second input terminal that is provided with the inverted test_mode_enable signal;

a 3-input OR function that has input terminals that are coupled to respective output terminals of the first, second, and third 2-input AND functions;

whereby, in a normal mode of operation, an inactive test_mode_enable signal activates the second and third 2-input AND functions and disables the first 2-input AND function so that the MRAS output signal is provided when either the NRAS signal or the RRAS signal is active;

whereby, in a test_mode of operation, an active test_mode_enable signal activates the first 2-input AND function and disables the second and third 2-input AND functions so that the MRAS output signal is provided when the inverted internal_ceb signal is active.

2. The self-refreshing SRAM of claim 1 wherein the first, second, and third AND functions are provided by respective 2-input NAND gates, each having an inverter connected to a respective output terminal of a respective 2-input NAND gates.

3. A method of testing a self-refreshing SRAM having DRAM cells, comprising the steps of receiving external control signals for the self-refreshing SRAM in an input buffer;

activating a test mode enable circuit with an external test mode command signal to provide an internal test_mode_enable signal;

arbitrating between normal external row access request signals and internal refresh request signals to provide a normal row access select signal NRAS or an internal refresh row access select signal RRAS;

receiving the test_mode_enable signal, an internal_ceb signal produced by the input buffer from a /CE input signal, the NRAS signal, and the RRAS signal in a memory control logic circuit;

providing a master row access select signal (MRAS) output signal from the memory control logic circuit that follows the internal_ceb signal when the test_mode_enable signal is active and that follows the NRAS or XRAS signal when the test_mode_enable signal is inactive;

wherein, the MRAS signal controls selection of rows of a memory cell array of the self-refreshing SRAM and wherein the MRAS signal also controls an address decode logic circuit for the self-refreshing SRAM so that in a test mode of operation, the refresh time of the memory cells can be externally controlled by the /CE signal to determine the real refresh time of the memory cells and the maximum refresh capability of the memory cells;

combining in a first 2-input AND function the test_mode_enable signed and the internal_ceb signal;

combining in a second 2-input AND function the NRAS signal and an inverted test_mode_enable signal;

combining in a third 2-input AND function the RRAS signal and the inverted test_mode_enable signal;

combining output signals from the first, second, and third 2-input AND functions in a 3-import OR function to provide the MRAS signal;

whereby, in a normal mode of operation, an inactive test_mode_enable signal activates the second and third 2-input AND functions and disables the first 2-input AND function so that the MRAS output signal is provided when either the NRAS signal or the RRAS signal is active;

whereby, in a test_mode of operation, an active test mode_enable signal activates the first 2-input AND function and disables the second and third 2-input AND functions so that the MRAS output signal is provided when the inverted internal_ceb signal is active.

\* \* \* \* \*